United States Patent
Yang et al.

(10) Patent No.: US 6,859,748 B1
(45) Date of Patent: Feb. 22, 2005

(54) TEST STRUCTURE FOR MEASURING EFFECT OF TRENCH ISOLATION ON OXIDE IN A MEMORY DEVICE

(75) Inventors: Nian Yang, San Jose, CA (US); Zhigang Wang, San Jose, CA (US); Tien-Chun Yang, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 105 days.

(21) Appl. No.: 10/190,420

(22) Filed: Jul. 3, 2002

(51) Int. Cl.[7] .......................... G01R 27/29; G01S 31/00
(52) U.S. Cl. .................. 702/117; 702/81; 324/765; 438/17
(58) Field of Search .............................. 702/57, 64, 65, 702/81–84, 108, 117–120, 182, 183, 185; 524/500, 519, 522, 523, 537, 759, 765, 766; 257/48; 438/11–17

(56) References Cited

U.S. PATENT DOCUMENTS

| | | | | |
|---|---|---|---|---|
| 4,851,370 A | * | 7/1989 | Doklan et al. | 438/762 |
| 4,985,673 A | * | 1/1991 | Horie | 324/765 |
| 5,109,257 A | * | 4/1992 | Kondo | 365/185.18 |
| 5,138,256 A | * | 8/1992 | Murphy et al. | 324/767 |
| 5,485,097 A | * | 1/1996 | Wang | 324/765 |
| 5,598,102 A | * | 1/1997 | Smayling et al. | 324/537 |
| 5,770,947 A | * | 6/1998 | Brauchle | 324/765 |
| 5,856,230 A | * | 1/1999 | Jang | 438/439 |
| 6,037,781 A | * | 3/2000 | Kono et al. | 324/537 |
| 6,073,781 A | * | 6/2000 | Puglisi | 211/70.6 |
| 6,289,291 B1 | * | 9/2001 | Wang et al. | 702/82 |
| 6,456,104 B1 | * | 9/2002 | Guarin et al. | 324/769 |
| 6,465,266 B1 | * | 10/2002 | Yassine et al. | 438/17 |
| 6,613,595 B2 | * | 9/2003 | Fan et al. | 438/18 |
| 6,734,028 B1 | * | 5/2004 | Yang et al. | 438/17 |
| 2002/0055273 A1 | * | 5/2002 | Hasegawa | 438/794 |

* cited by examiner

Primary Examiner—Donald E. McElheny, Jr.
Assistant Examiner—Manuel L. Barbee

(57) ABSTRACT

An apparatus for measuring effects of isolation processes (280) on an oxide layer (286) in a memory device (255) is described. In one embodiment, the apparatus comprises a structure (110) comprised of an array (110c) of memory devices (255). A testing unit (120) is coupled with the structure (110). The testing unit (120) is for performing various electrical tests on the array (110c) of memory devices (255). The testing unit (120) is also for providing data regarding each memory device (255) in the array (110c) of memory devices (255). An analyzer (120) is coupled with the structure (110) for analyzing results of the various electrical tests. This determines the condition of the oxide layer (286) of each memory device (255) in the array of memory devices (110c).

24 Claims, 16 Drawing Sheets

TEST STRUCTURE FOR MEASURING EFFECT OF TRENCH ISOLATION ON OXIDE IN A MEMORY DEVICE

FIELD OF THE INVENTION

The present invention relates to measuring effects of processes performed upon oxides in memory devices. More particularly, the present invention relates to a testing structure for measuring edge and corner effects of shallow trench isolation on tunnel oxides in a flash memory device.

BACKGROUND ART

Advancements in technology and processes related to memory device fabrication have enabled continued scaling down (size reduction) of memory devices. As a memory device is scaled down, memory density is increased and the speed of the memory device is also increased. A contributory factor in the continuing scaling down of memory devices is the development of and introduction of STI (shallow trench isolation) into memory device fabrication.

Implementing STI (shallow trench isolation) in memory device fabrication has enabled developers to properly scale down the memory device and improve circuit density. State of the art memory devices are being fabricated utilizing shallow trench isolation in the core memory area, realizing an improvement in memory density. Additionally, employing STI in memory device fabrication also maintains critical properties of a memory device, such as data retention, charge leakage, and device reliability under high voltage programming/erase operations.

In memory device fabrication, one crucial process is the formation of the tunnel oxide. Tunnel oxide formation is closely coupled to STI related processes. During the formation of STI, the silicon can be damaged at the STI corner (where the edges are compressed) and at the edge. STI damage is more severe at the corner due to compressed edges causing crystal disruption and/or crystal dislocation. This leads to imperfect tunnel oxide edge formation which can cause oxide edge degradation. Oxide edge degradation is a contributing factor in reliability, charge retention, and leakage problems in memory devices.

Current testing devices, e.g., long finger structures, provide information regarding tunnel oxide formation based on electrical measurements of the edge portions of a memory device. However, in a practical application finger structures are not present. Accordingly, edge measurements alone do not provide adequate information with regard to the formation of the oxide, e.g., tunnel oxide, in a memory device, e.g., a flash memory device.

Thus, a need exists for an apparatus to provide more comprehensive measurements related to oxide formation. An additional need exists for an apparatus to include corner characteristics in the measurements related to oxide formation. Yet another need exists for an apparatus that provides those measurement in a simple manner and which is readily implemented during the fabrication of a memory device.

DISCLOSURE OF THE INVENTION

Embodiments of the present invention are drawn to providing an apparatus and method for measuring effects of isolation processes, e.g., shallow trench isolation, on oxide formation, e.g., tunnel oxide in a memory device, e.g., a flash memory device. Embodiments of the present invention further provide an apparatus to provide more comprehensive measurements related to oxide formation. Embodiments of the present invention further provide an apparatus which includes corner characteristics in measurements related to oxide formation. Embodiments of the present invention additionally provide an apparatus that obtains those measurement in a simple manner and which is readily implemented during the fabrication of a memory device.

An apparatus for measuring effects of isolation processes on an oxide layer in a memory device is described. In one embodiment, the apparatus comprises a structure comprised of an array of memory devices. A testing unit is coupled with the structure. The testing unit is for performing various electrical tests on the array of memory devices. The testing unit is also for providing data regarding each memory device in the array of memory devices. An analyzer is coupled with the structure for analyzing results of the various electrical tests. This determines the condition of the oxide layer of each memory device in the array of memory devices.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODES FOR CARRYING OUT THE INVENTION

A method and apparatus for measuring effects of shallow trench isolation on oxide formation in a memory device. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

Some portions of the detailed descriptions, which follow, are presented in terms of procedures, steps, logic blocks, processing, and other symbolic representations of operations performed on a memory device during fabrication. These descriptions and representations are the means used by those skilled in the fabrication arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a testing/analyzing device. It has proven convenient at times, principally for reasons of common usage, to refer to these signals as bits, values, elements, symbols, characters, terms, numbers, or the like.

The present invention, a test structure for measuring effects of STI (shallow trench isolation) on oxide formation in a memory device is described. In one example of one embodiment of the present invention, the memory device is a flash memory device. In one example of one embodiment, the oxide formed is tunnel oxide. However, it is noted that the present invention can be utilized to test almost any type of oxide formation, including gate oxide formation. Additionally, embodiments of the present invention are well suited for implementation in the fabrication of nearly all memory devices.

For purposes of the present application, the term "oxide formation" is not limited solely to the formation of tunnel oxide in a flash memory device. Instead, the term "oxide formation" is also intended to include nearly any oxide formation, including but not limited to gate oxide formation in alternative memory devices. As such, for purposes of the present application, the terms "tunnel oxide formation" and "oxide formation" will be considered synonymous and will be used interchangeably throughout the present application.

Figure 1:
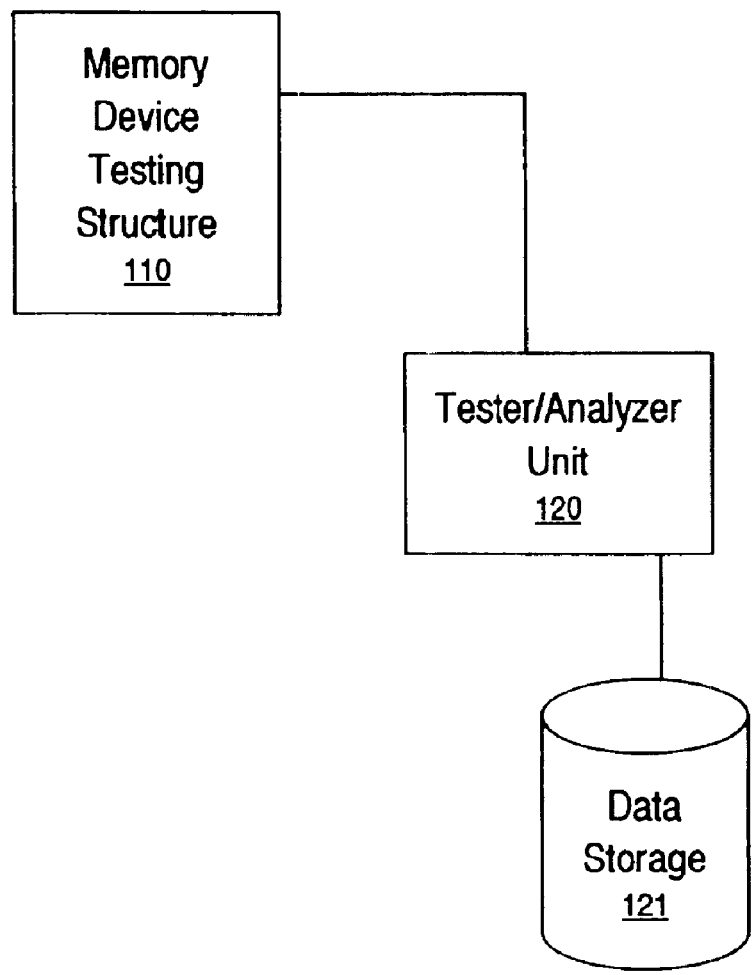
FIG. 1 is a block diagram of a structure for testing memory devices, a tester/analyzer unit, and a data storage device, in accordance with one embodiment of the present invention.

FIG. 1 is a block diagram of a test environment 100, in one embodiment of the present invention. Test environment 100 is shown having a testing structure 110, e.g., test structure 110a–d of FIGS. 4a–d, respectively, wherein an array of memory devices, e.g., memory device 255f of FIG. 2F, are disposed therein for testing. Coupled to test structure 110 is tester/analyzer unit 120. Tester/analyzer 120 performs tests and analyzes the results of the tests performed upon each of the memory devices in an array of memory devices disposed in test structure 110. In one embodiment, as shown in FIG. 1, tester/analyzer 120 is coupled with an external data storage unit 121. Data storage unit 121 is for storing the data acquired and analyzed (e.g. parameters) during the testing of the memory devices. In another embodiment, data storage unit 121 can be integrated in tester/analyzer unit 120, such as a 4145B tester/analyzer available from Hewlett-Packard Company of Palo Alto, Calif. It is noted that numerous tester/analyzers are currently available, and reference to the 4145B is for exemplary purposes and should not be considered as definitive or limiting in nature within the context of the present disclosure.

Referring to FIGS. 2A–2F collectively, cross-sectioned views of a memory device, e.g., memory device 255a–f, during fabrication are shown. FIGS. 2A–2F are sequentially presented to illustrate processes performed during fabrication of a memory device prior to measuring a memory device to determine effects of STI (shallow trench isolation) on tunnel oxide formation in a memory device.

Figure 2A:
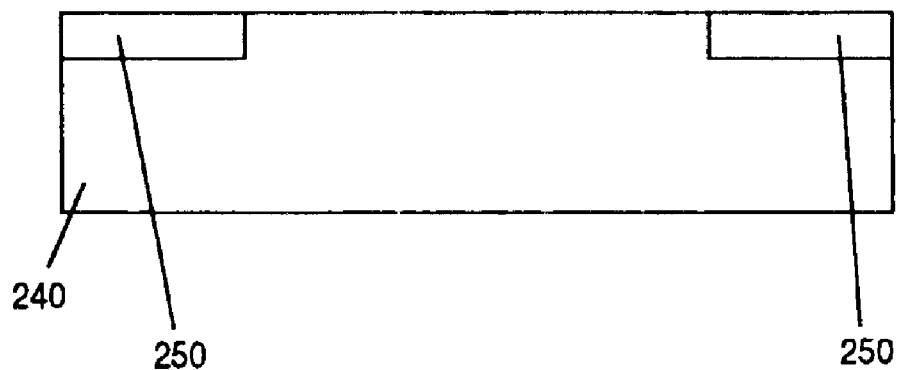
FIG. 2A is a block illustration of processes performed upon a substrate of a memory device resulting in the formation of electrode areas, in accordance with one embodiment of the present invention.

In FIG. 2A, processes associated with preliminary fabrication of a memory device have been performed upon memory device 255a including, but not limited to, growing and slicing and polishing a crystal ingot, and doping processes associated with forming silicon substrate 240, including forming a p-type substrate, forming a deep-n well substrate, forming a p-well, and forming an electrode region, e.g., source/drain region 250. In one embodiment, memory device 255a can be flash memory device. In another embodiment, memory device 255a can be an alternative memory device.

Figure 2B:
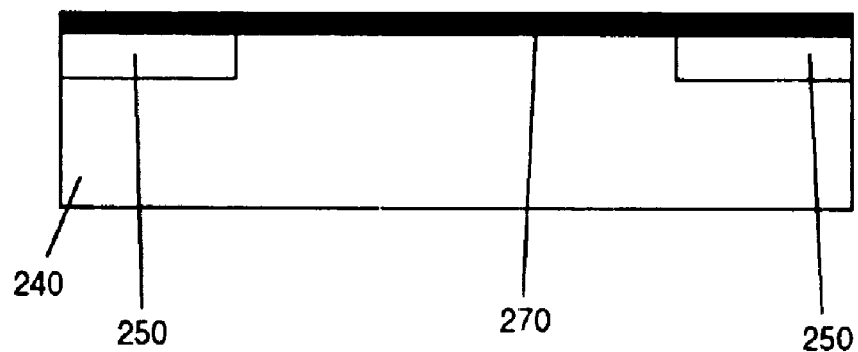
FIG. 2B is a block illustration of processes performed on the memory device of FIG. 2A resulting in the formation of a nitride layer thereon, in accordance with one embodiment of the present invention.

In FIG. 2B, processes associated with nitride layer formation and masking have been performed upon memory device 255a, resulting in a memory device 255b with a nitride/mask layer 270, as shown.

Figure 2C:
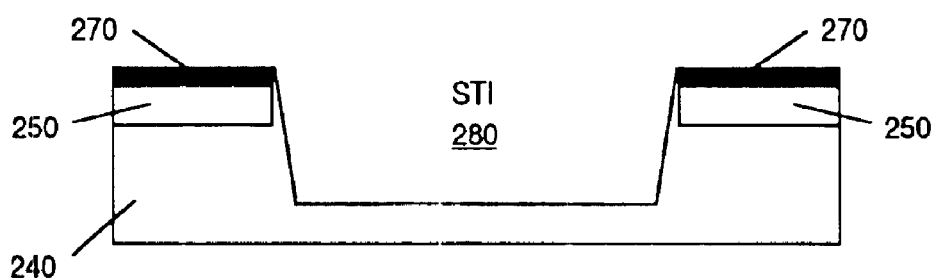
FIG. 2C is a block illustration of etching and other processes performed on the memory device of FIG. 2B resulting in the formation of a trench therein, in accordance with one embodiment of the present invention.

In FIG. 2C, processes associated with etching of nitride/mask layer 270 have been performed upon memory device 255b, resulting in a memory device 255c with an etched STI (shallow trench isolation) trench 280, as shown.

Figure 2D:
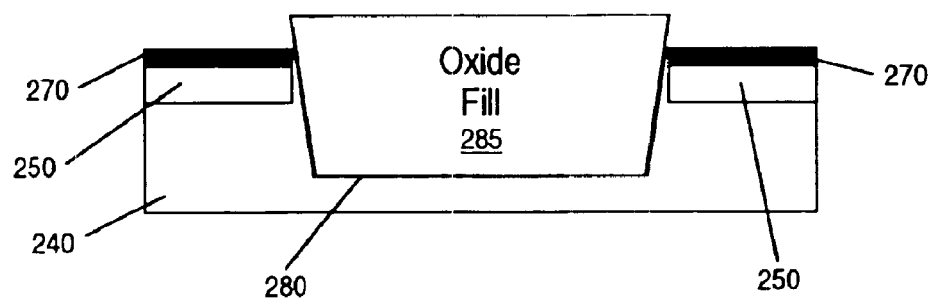
FIG. 2D is a block illustration of processes performed upon the memory device of FIG. 2C resulting in the filling of the formed trench with an oxide, in accordance with one embodiment of the present invention.

In FIG. 2D, processes associated with filling STI trench 280 of memory device 255c with an oxide have been performed upon memory device 255c, resulting in a memory device 255d with an oxide fill 285 in STI 280. It is noted that other processes, such as photoresist removal, liner oxidation, and densification of the oxide may have been performed in conjunction with the oxide fill.

Figure 2E:
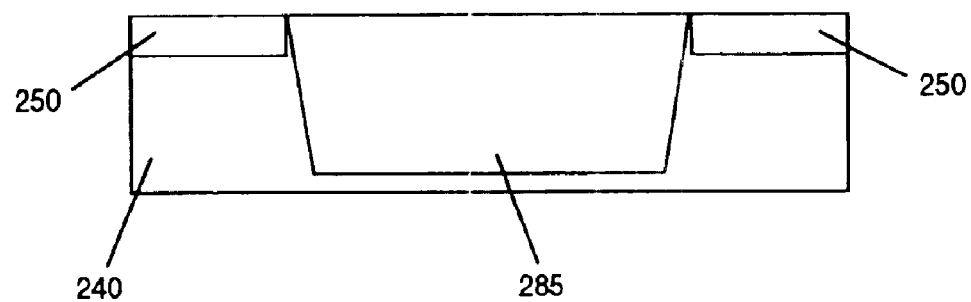
FIG. 2E is a block illustration of CMP (chemical mechanical polishing) processes (to remove portions of the oxide) and nitride removal processes (to remove the nitride) performed upon the memory device of FIG. 2D thus exposing the electrode areas, in accordance with one embodiment of the present invention.
Figure 2F:
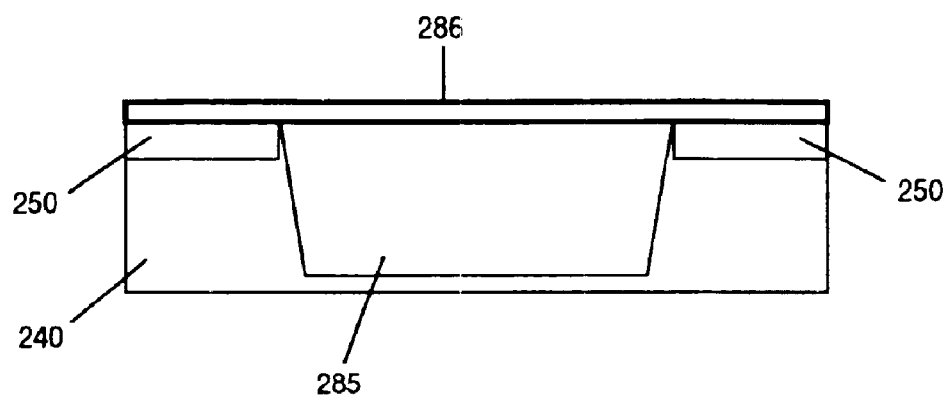
FIG. 2F is a block illustration of processes performed upon the memory device of FIG. 2E resulting in the formation of tunnel oxide, in accordance with one embodiment of the present invention.

In FIG. 2E, processes associated with CMP (chemical mechanical polishing) and nitride removal (strip) have been performed upon memory device 255d, resulting in a memory device 255e with source/drain regions 250 exposed.

In FIG. 2F, processes associated with cleaning and formation of a tunnel oxide layer have performed upon memory device 255e, resulting in a memory device 255f with a formed tunnel oxide layer 286, as shown. It is at this juncture in a process of fabricating memory device 255a–f that a testing for effects of STI (shallow trench isolation) on a tunnel oxide formation is conducted.

Figure 3A:
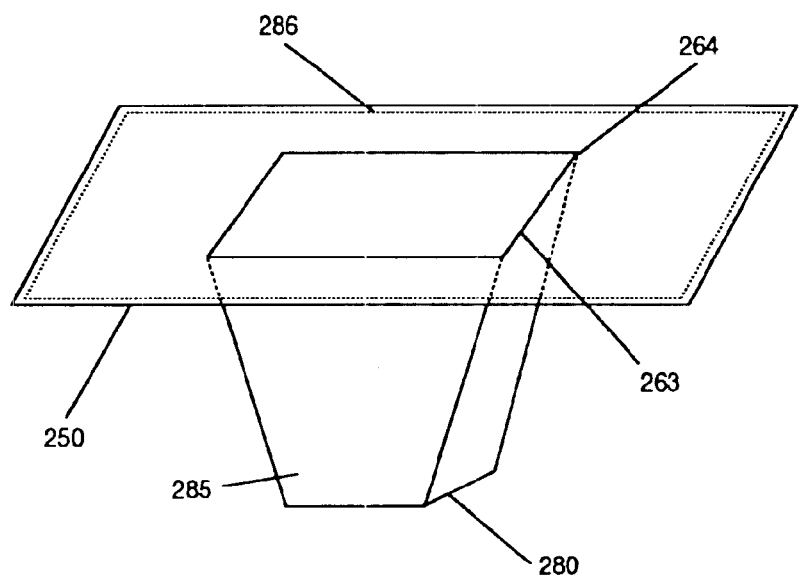
FIG. 3A is a block illustration of a top/front-angled view of the memory device of FIG. 2F, in accordance with one embodiment of the present invention.

FIG. 3A is a block illustrated top/front-angled view of memory device 255f, analogous to memory device 255f of FIG. 2F. Memory device 255f shows a formed STI 280, an oxide fill 285, a source/drain region 250, and an oxide layer 286 (indicated with a dotted line). Formed STI 280 is shown to have an edge 263 and a corner 264. It is noted that there are four edges 263 and corners 264 within a formed STI 280. For purposes of the present disclosure, edges 263 will be considered as referring to all four edges 263 and corners 264 will be considered as referring to all four corners 264.

Figure 3B:
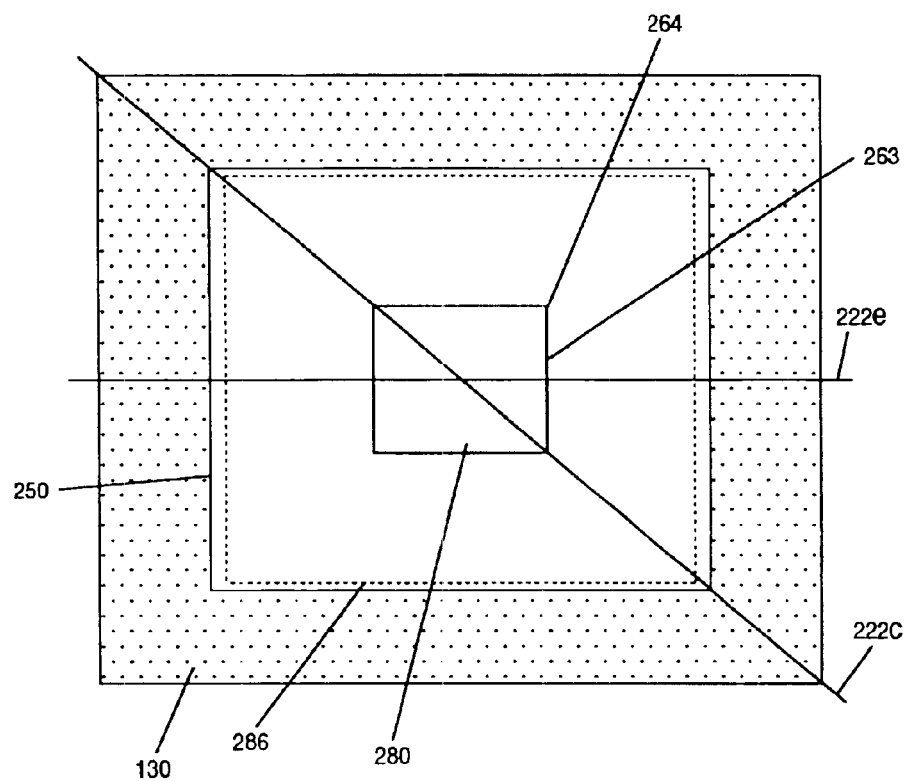
FIG. 3B is a block illustration of a top-view view of the memory device of FIG. 2F, in accordance with one embodiment of the present invention.

FIG. 3B is block illustrated top-view perspective of a memory device 255f, analogous to memory device 255f of FIG. 2F. Memory device 255f is shown having an sT 280, a source/drain region 250, a tunnel oxide 286 (indicated by dotted line), and a field area 130. In one embodiment, field area 130 is an area of a test structure 110, e.g., test structure 110b of FIG. 4B that encompasses memory devices when disposed therein. Also shown are edge line 222e and corner line 222c. Edge line 222e indicates measurements of the electrical tests performed at edges 263 of STI 280 and corner line 222c indicates the measurements of electrical tests performed at corners 264 of STI 280 in memory device 255f. In one embodiment, the electrical tests can include, but are not limited to, capacitance-voltage tests, current-injection tests, and current-voltage tests. Accordingly, alternative tests can also be conducted upon memory device 255f.

Figure 4A:
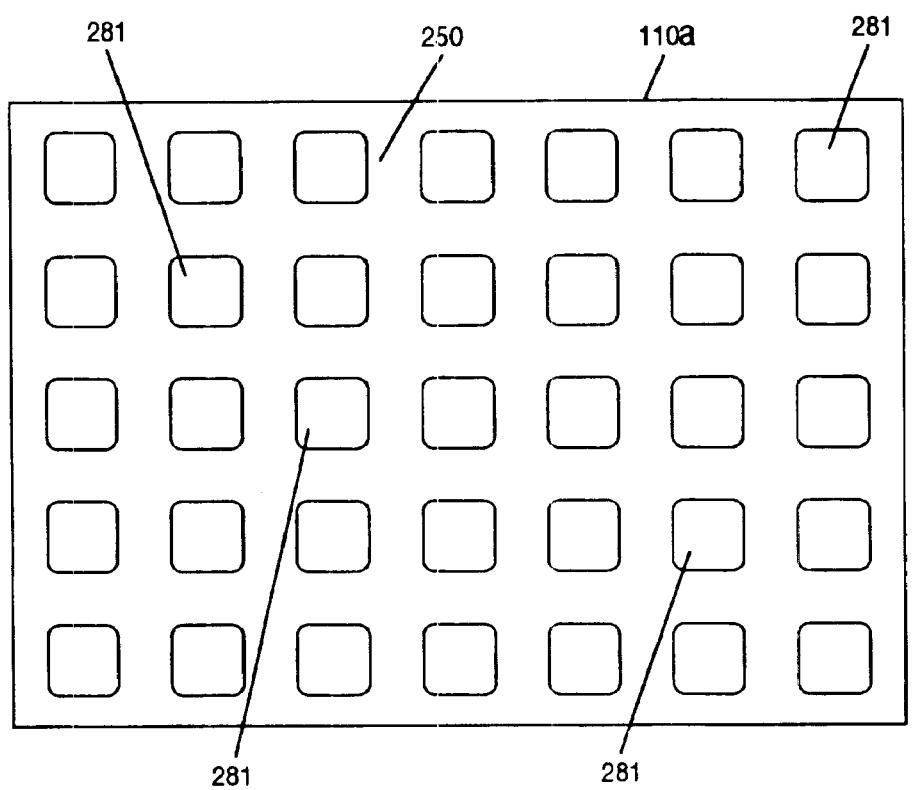
FIG. 4A is a block illustration of one example of a memory device testing structure, in accordance with one embodiment of the present invention.
Figure 4B:
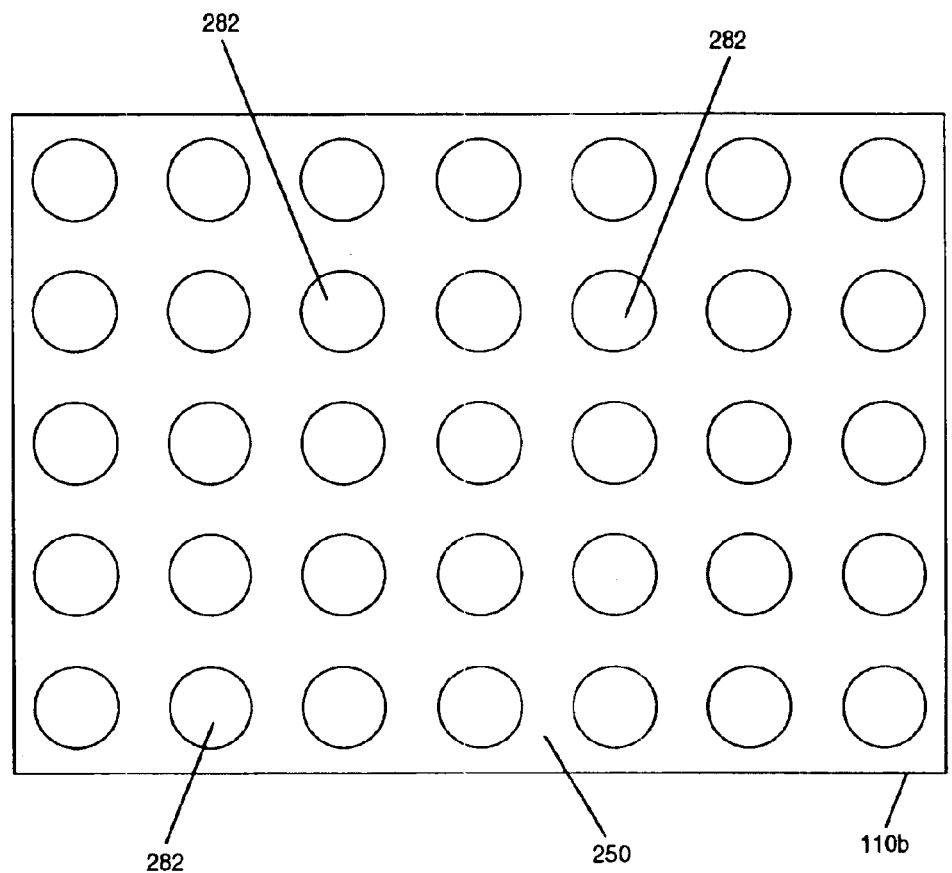
FIG. 4B is a block illustration of another example of a memory device testing structure, in accordance with one embodiment of the present invention.

Referring collectively to FIGS. 4A and 4B, a test structure 110a and a control test structure 110b are shown, respectively. Although thirty-five STI squares 281 and thirty-five STI circles 282 are shown in test structure 110a and control test structure 110b, respectively, a greater number or a lesser number of STI squares 281 or STI circles 282 can be disposed thereon.

FIG. 4A is a block illustration of a test structure 110, e.g., test structure 110a, in one embodiment of the present invention. In the present embodiment, test structure 110a is shown having an array of thirty-five STI squares 281. STI squares 281 are analogous to an STI 280 (as described in FIGS. 2C, 3A, and 3B) except that an STI square 281 is designed with the least design rules. Test structure 110a is also shown having a source/drain region 250 encompassing each STI 281. Measurements from electrical tests (described in FIG. 3B) conducted on each STI square 281 include measurements of corners 264 and edges 263, which are analyzed by tester/analyzer 120 coupled to test structure 110a (shown in FIGS. 1 and 5A).

FIG. 4B a block illustration of a control test structure 110, e.g., control test structure 110b, in one embodiment of the present invention. In the present embodiment, control test structure 110b is shown having an array of thirty-five STI circles 282. Control test structure 110b is also shown having a source/drain region 250 encompassing each STI circle 282. Control test structure 110b is adapted for utilization with test environment 100. STI circles 282 are analogous to an STI 280 (as described in FIGS. 2C, 3A, and 3B) except that an STI circle 282 is designed with the least design rules. It is noted that the perimeter of an STI circle 282 is equivalent to the perimeter of an STI square 281. Thus, measurements from electrical tests conducted on each STI circle 282 include perimeter values, but do not include corners 264, as no corners 264 are present in an STI circle 282.

Still referring collectively to FIGS. 4A and 4B, results of measurements of electrical tests conducted on STI circles 282 in control test structure 110b are then compared with results of measurements of electrical tests conducted on STI squares 281 in test structure 110a by tester/analyzer 120. By virtue of an STI circle 282 having a perimeter (edge) analogous to the edges 263 of an STI square 281, a difference in test results can therefore be attributed to corner damage incurred during formation of an STI 280. Corner damage includes silicon stress, crystal imperfections, crystalline dislocations, and the like. Further, corner damage is directly attributable to an imperfect tunnel oxide edge, causing oxide edge degradation. By providing an apparatus that incorporates corner measurements in the electrical tests conducted on memory devices, a more comprehensive evaluation of the memory device is realized.

Figure 4C:
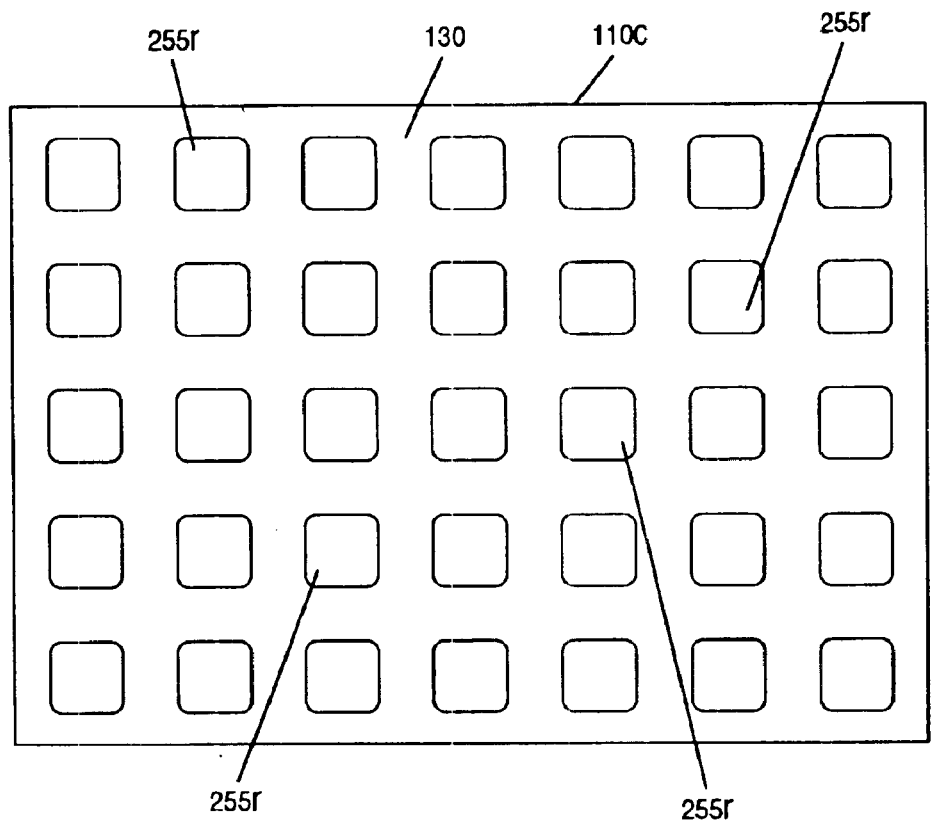
FIG. 4C is a block illustration of one example of a memory device control testing structure, in accordance with one embodiment of the present invention.
Figure 4D:
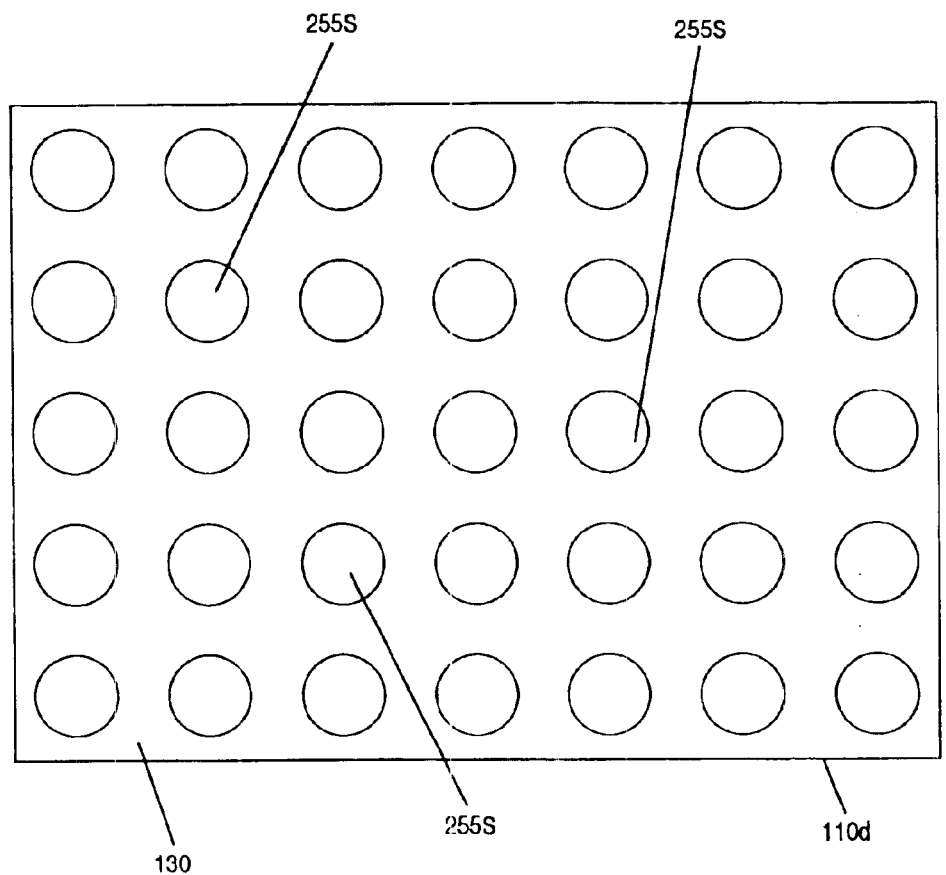
FIG. 4D is a block illustration of another example of a memory device control testing structure, in accordance with one embodiment of the present invention.

Referring now to FIGS. 4C and 4D, a test structure 110c and a control test structure 110d are shown, respectively. Although thirty-five rectangular memory devices 255r and thirty-five circular memory devices 255s are shown in test structure 110c and control test structure 110d, respectively, a greater number or a lesser number of rectangular memory devices 255r or circular memory devices 255s can be disposed thereon.

Figure 5A:
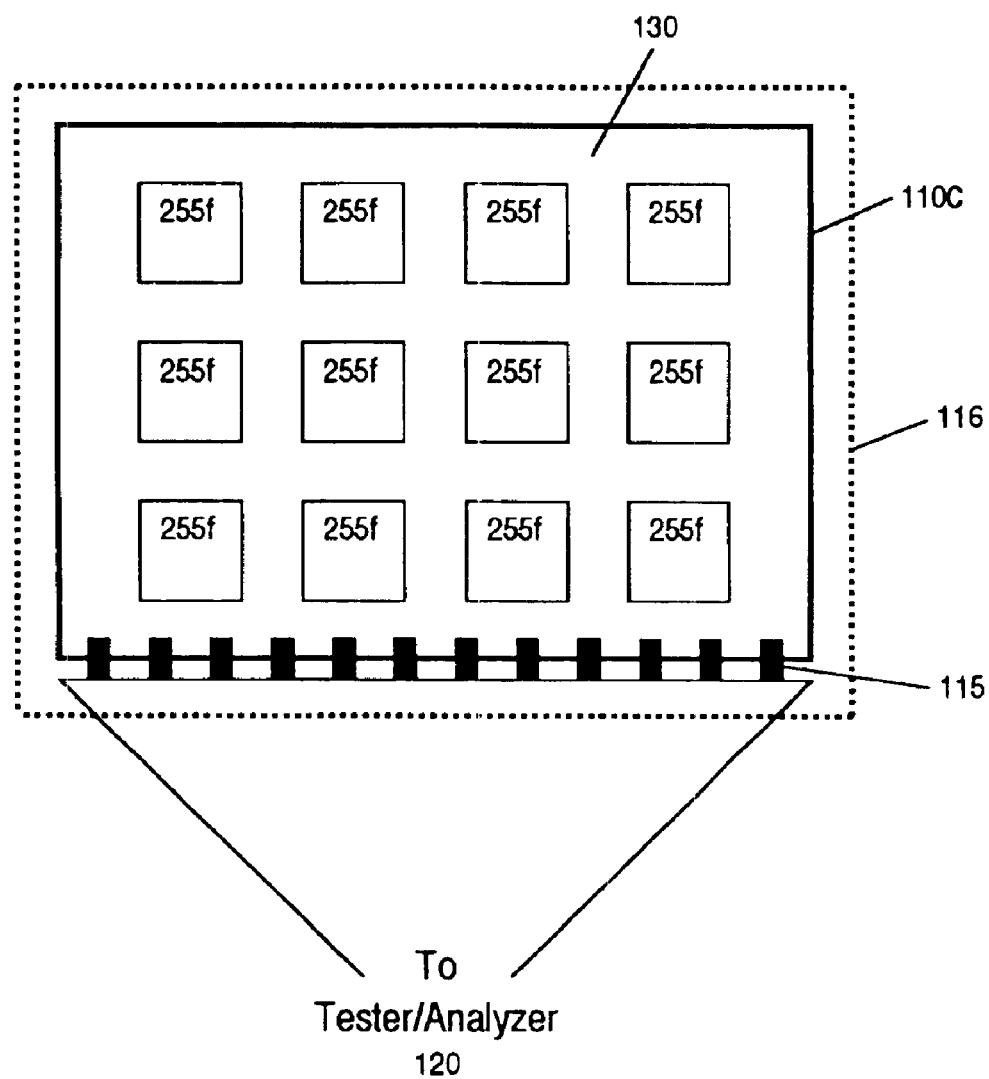
FIG. 5A is a block illustration of a memory device testing structure coupled with a tester/analyzer unit, in accordance with one embodiment of the present invention.

FIG. 4C is a block illustration of a test structure 110, e.g., test structure 110c, in another embodiment of the present invention. In the present embodiment, test structure 110c is shown having an array of thirty-five memory devices 255r (analogous to memory device 255f of FIG. 2F) disposed therein. Test structure 110c is also shown having a field area 130 encompassing each memory device 255r. Measurements from electrical tests (described in FIG. 3B) conducted on each memory device 255r, including corners 264 and edges 263, are analyzed by tester/analyzer 120 coupled to test structure 110c (as shown in FIGS. 1 and 5A), and results are compared to results from tests conducted on control test structure 110d.

FIG. 4D is a block illustration of a control test structure 110, e.g., control test structure 110d, in another embodiment of the present invention. In the present embodiment, control test structure 110d is shown having an array of thirty-five circular memory devices 255s disposed therein. Control test structure 110d is adapted for utilization with test struture environment 100. Memory device 255s is analogous to memory device 255r of FIG. 4C and memory device 255f of FIGS. 2F, 3A, and 3B, except that it has a circular form, instead of rectangular. Control test structure 110d is also shown having a field area 130 encompassing each memory device 255s. It is noted that the perimeter of a memory device 255s is equivalent to the edges 263 of a memory device 255r. Thus, measurements from electrical tests conducted on each memory device 255s include perimeter values, but do not include corners 264, as no corners 264 are present in a memory device 255s. By virtue of measurements from electrical tests (described in FIG. 3B) conducted on each memory device 255f, including corners 264 and edges 263, are analyzed by tester/analyzer 120 coupled to test structure 110c (as shown in FIGS. 1 and 5A). The results are compared to an analogous control test structure 110d. A difference in the results of measurements of electrical tests obtained from the test structure 110c compared to the control test structure 110d results indicates imperfect tunnel oxide formation.

Still referring collectively to FIGS. 4C and 4D results of measurements of electrical tests conducted on memory devices 255s in control test structure 110d are then compared with results of measurements of electrical tests conducted on memory devices 255r in test structure 110c by tester/analyzer 120. By virtue of a memory device 255s having a perimeter (edge) analogous to the edges 263 of an memory device 255r, a difference in test results can therefore be attributed to corner damage incurred during formation of an STI 280. Corner damage includes silicon stress, crystal imperfections, crystalline dislocations, and the like. Further, corner damage is directly attributable to an imperfect tunnel oxide edge, causing oxide edge degradation. By providing an apparatus that incorporates corner measurements in the electrical tests conducted on memory devices, a more comprehensive evaluation of the memory device is realized.

By virtue of determining the condition of tunnel oxide prior to completion of fabrication of a memory device, the electrical test data can be utilized proactively to improve, alter, or readapt the fabrication process regarding the STI formation. One solution is that designers can implement a lighter STI formation or implement a stronger or lighter etch. Another solution is that designers can improve the design rule, such that the memory device is fabricated with rules for keeping a certain distance for the defect. Yet another solution is to improve the design itself, e.g., placing a layer of some material, (a nitride or alternative protecting material to prevent further degradation) on a corner of an edge, covering the entire memory device.

FIG. 5A is a block illustration of a test structure 110, e.g., test structure 110c of FIG. 4C coupled with a tester/analyzer 120, in one embodiment of the present invention. In this embodiment, test structure 110c is shown having an array of twelve memory devices 255f disposed thereon. A memory device 255f of FIG. 5A is analogous to memory device 255f of FIGS. 2F, 3a, and 3B. A layer of polysilicon covers the array of memory devices 255f, as indicated by dotted line 116. A polysilicon layer is required to protect the memory devices and to provide conductivity. Coupled to the layer of polysilicon are a plurality of contacts 115 which communicatively and electrically couple test structure 110c to a tester/analyzer, e.g., tester/analyzer 120 of FIG. 1. A contact 115 can be made from a variety of metals including, but not limited to, aluminum, copper, gold, and/or tungsten.

Figure 5B:
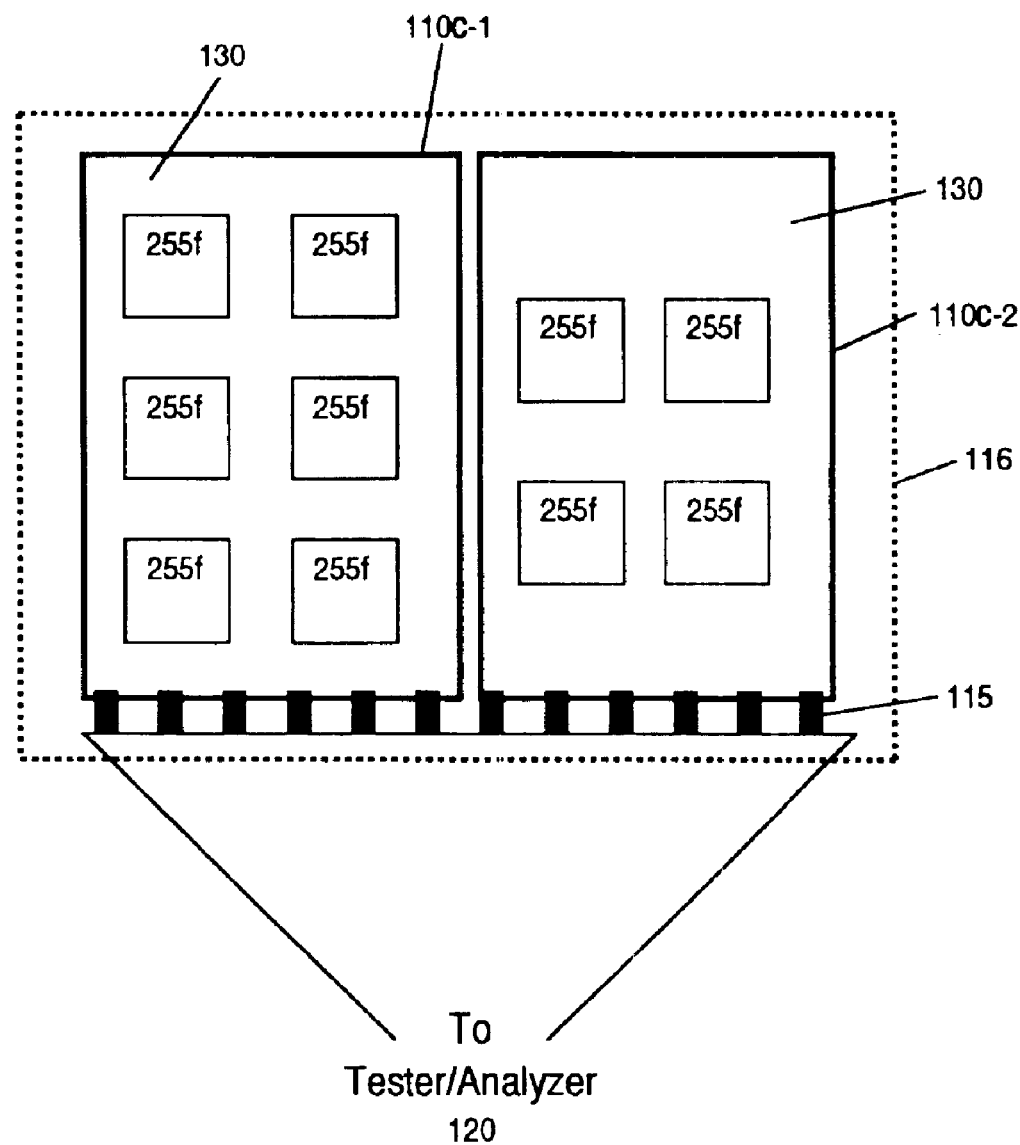
FIG. 5B is a block illustration of a plurality of memory device testing structures coupled with a tester/analyzer unit, in accordance with one embodiment of the present invention.

FIG. 5B is a block illustration of a plurality of test structures 110c, e.g., test structure 110c-1 and 110c-2, coupled with tester/analyzer 120. In FIG. 5B, each test structure contains an array of memory devices 255f, although in another implementation, each test structure can contain an array of STIs 280, as shown in FIG. 4A. Also shown are field areas 130, contacts 115, and a polysilicon layer covering both test structure 110c-1 and test structure 110c-2, as indicated by dotted line 116. FIG. 5B illustrates the flexibility of the present invention by showing that more than one test structure can be electrically tested simultaneously. It is noted that additional test structures can be added, thus the number of test structures shown in FIG. 5B is exemplary and should not be construed as limiting. Additionally, simultaneous testing of arrays of 255f and/or arrays of 280s is an efficient and effective method of testing for tunnel oxide defects.

Figure 6:
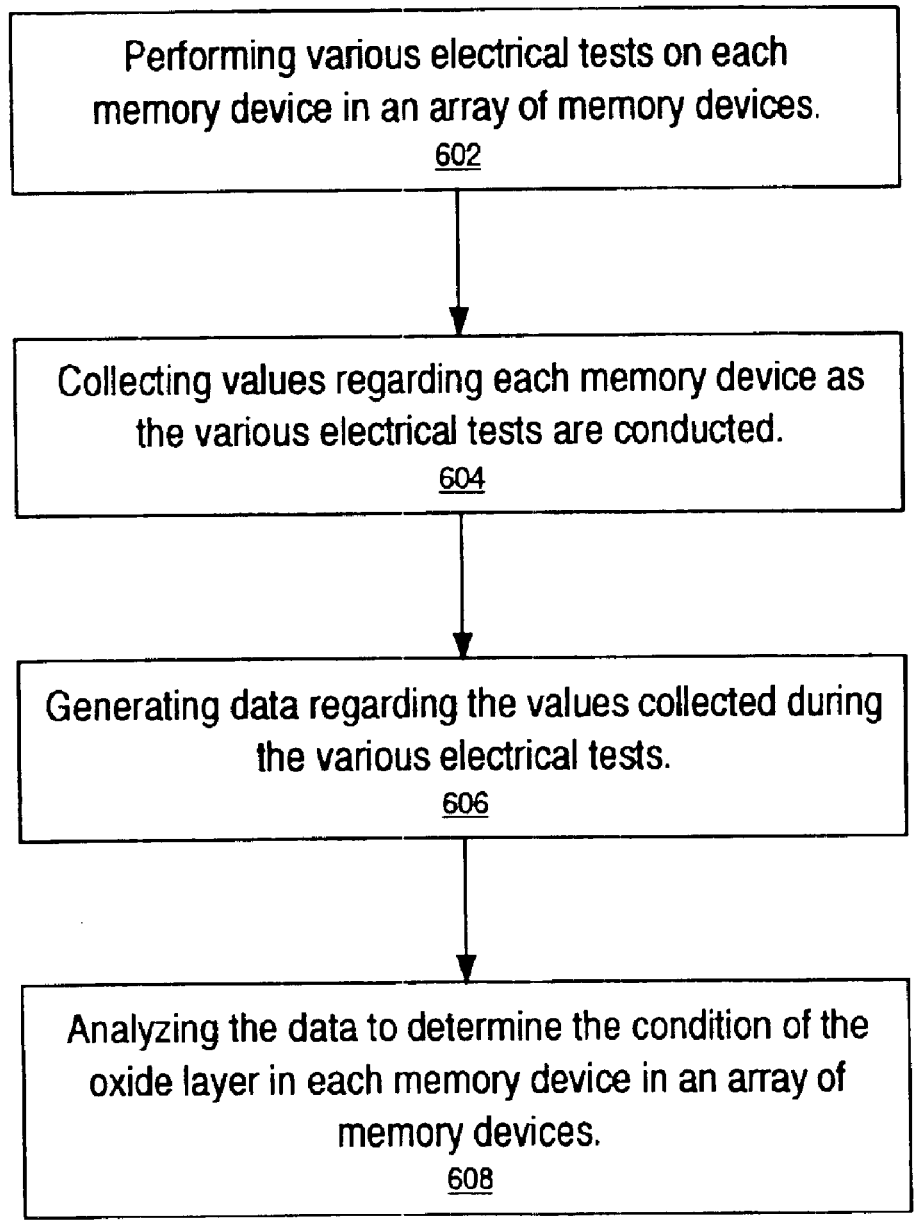
FIG. 6 is a flowchart of a process of determining the condition of an oxide layer in memory device, in accordance with one embodiment of the present invention.

FIG. 6 is a flowchart 600 of steps performed in accordance with one embodiment of the present invention for measuring electrical tests to determine effects of STI on tunnel oxide in a memory device, e.g., a flash memory device. Flowchart 600 includes processes of the present invention which, in one embodiment, are carried out by an electrical testing and analyzing device, e.g., tester/analyzer 120 of FIG. 1. Although specific steps are disclosed in flowchart 600, such steps are exemplary. That is, the present invention is well suited to performing various other steps or variations of the steps recited in FIG. 6. Within the present embodiment, it should be appreciated that the steps of flowchart 600 may be performed by software, by hardware or by any combination of software and hardware.

In step 602 of FIG. 6, a memory device, e.g., a memory device 255 is being fabricated, as described in FIGS. 2A–2F.

At the juncture as shown in FIG. 2F, memory device 255f is tested. Memory device 255f is arrayed in a test structure, e.g., memory device 255r in test structure 110c of FIG. 4C. Prior to testing, a layer of polysilicon is placed on top of test structure 110c, and contacts, e.g., contacts 115 are formed and then test structure 110c is coupled to a tester/analyzer, e.g., tester/analyzer unit 120 of FIG. 1, which then conducts various tests on memory devices 255r. It is noted that in another embodiment, test structure 110c can be comprised of STIs 282, as shown in test structure 110a in FIG. 4A. Electrical testing, in one embodiment, can include, but is not limited to, capacitance-voltage tests, current injection tests, and current-voltage tests.

In step 604 of FIG. 6, each memory device 255r in the array of memory devices 255f disposed in test structure 110c is then tested and the measurements of the electrical tests are collected. The measurements include edges 263 and corners 264, shown as edge measure 222e and corner measure 222c in FIG. 3B.

In step 606 of FIG. 6, subsequent to the completion of the electrical tests being conducted on the array of memory devices 255f in test structure 110c, tester/analyzer unit 120 generates data regarding the measurements obtained during the testing.

In step 608 of FIG. 6, tester/analyzer unit 120 compares the results of the electrical tests conducted on test structure 110c with results of electrical tests conducted on a control test structure, e.g., control test stucture 110d. In the present embodiment, because the results of tests on control test structure menasurments rements are based on perimeter measurements (edge), and the results of measurements of electrical tests conducted on test structure 110c are based on measurements including edges 263 and corners 264, a difference between the two results indicated that the silicon was damaged during the formation of an STI, e.g., STI 280 of FIG. 2C, resulting in an inperfect tunnel oxide. This can cause oxide edge degradation, thus causing realiability, charge retentention, and leakage problems in a memory device 255.

In conclusion, by providing more comprehensive data negarding certain electrical tests conducted on a memory device, e.g., a flash memory device, during its fabrication process, problems associated with damage and defects within the memory device, in particular during STI formation, can be reduced or eliminated, thus enabling fabrication of less problematic memory devices.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of evaluating an integrated circuit fabrication process comprising:

performing an electrical test on a test structure comprising a first region having a polygon cross-section;

measuring a parameter of said electrical test performed on said test structure;

performing said electrical test on a control test structure comprising a second region having a circular cross section, wherein a perimeter of said circular cross section is substantially equal to a perimeter of said polygon cross-section;

measuring said parameter of said electrical test performed on said control test structure;

determining a corner effect on said parameter as a function of the difference between said measured parameter of said electric test performed on said test structure and said measured parameter of said electrical test performed on said control test structure.

2. The method according to claim 1, wherein said parameter is selected from a group consisting of silicon stress, crystal imperfection, crystalline dislocation, oxide layer imperfection.

3. The method according to claim 1, wherein said electrical test comprises a capacitance-voltage test.

4. The method according to claim 1, wherein said electrical test comprises a current injection test.

5. The method according to claim 1, wherein:

said first region comprises an isolation region; and said second region comprises an isolation region.

6. The method according to claim 1, wherein:

said first region comprises a device region; and said second region comprises a device region.

7. An apparatus for evaluating a memory device comprising:

a means for performing various electrical tests upon a test structure, wherein said test structure comprises a plurality of regions having edges and corners;

means for collecting a first set of values regarding said various electrical tests conducted on said test structure;

a means for performing various electrical tests upon a control test structure, wherein said control test structure comprises a plurality of regions having an edge and no corners and having a perimeter substantially equal or analogous to a perimeter of said test structure;

means for collecting a second set of values regarding said various electrical tests conducted on said control test structure; and a means for generating data regarding a difference between said first set of values and said second set of values.

8. The apparatus according to claim 7, wherein said first and second set of values comprise capacitance-voltage values, current injection values and current-voltage values.

9. The apparatus according to claim 7, wherein said plurality of regions comprise shallow trench isolation regions.

10. The apparatus according to claim 7, wherein said plurality of regions comprise device regions.

11. The apparatus according to claim 7, further comprising a means for storing said first set of values and said second set of values.

12. The apparatus according to claim 7, further comprising a means for storing said data.

13. An apparatus for evaluating a memory device fabrication process comprising:

a test structure comprising an array of first regions, each having a corner, formed in a second region;

a control test structure comprising an array of third regions, each not having said corner, formed in a forth region, wherein a perimeter of said array of third regions are substantially equal to a perimeter of said array of first regions;

a test unit coupled to said test structure and to said control test structure, for performing an electrical test on said test structure and said control test structure; and an analyzer coupled to said test structure and to said control test structure, for determining a parameter as a function of said electrical test performed on said test structure and said control test structure.

14. The apparatus according to claim 13, wherein:

said array of first regions comprise an array of shallow trench isolation regions;

said second region comprises a source/drain region;

said array of third regions comprise said array of shallow trench isolation regions; and said fourth region comprises said source/drain region.

15. The apparatus according to claim 13, wherein:

said array of first regions comprise an array of memory devices;

said second region comprises a field area;

said array of third regions comprise said array of memory devices; and said fourth region comprises said field area.

16. The apparatus according to claim 15, wherein said array of memory device comprises an array of flash memory devices.

17. The apparatus according to claim 13, wherein:

said test structure further comprises a dielectric deposited upon said array of first regions and said second region; and said control test structure further comprises a dielectric deposited upon said array of third regions and said fourth region.

18. The apparatus according to claim 17, wherein said dielectric comprises a gate oxide layer.

19. The apparatus according to claim 17, wherein said dielectric comprises a tunnel oxide layer.

20. The apparatus according to claim 17, wherein:

said test structure further comprises a layer of polysilicon deposited upon said dielectric; and said control test structure further comprises a layer of polysilicon deposed upon said dielectric.

21. The apparatus according to claim 13, wherein said parameter is selected from a group consisting of silicon stress, crystal imperfection, crystalline dislocation, oxide layer imperfection.

22. The apparatus according to claim 13, wherein said electrical test comprises a capacitance-voltage test.

23. The apparatus according to claim 13, wherein said electrical test comprises a current injection test.

24. The apparatus according to claim 13, further comprising a data storgae unit for storing said parameter.

* * * * *